United States Patent [19]
Rose

[11] Patent Number: 4,962,313
[45] Date of Patent: Oct. 9, 1990

[54] WIEN-TYPE IMAGING CORRECTOR FOR AN ELECTRON MICROSCOPE

[75] Inventor: Harald Rose, Darmstadt, Fed. Rep. of Germany

[73] Assignee: Carl-Zeiss-Stiftung, Heidenheim/Brenz, Fed. Rep. of Germany

[21] Appl. No.: 448,270

[22] Filed: Dec. 11, 1989

[30] Foreign Application Priority Data

Dec. 10, 1988 [DE] Fed. Rep. of Germany ....... 3841715

[51] Int. Cl.$^5$ .............................................. G21K 1/08
[52] U.S. Cl. ................................... 250/311; 250/310; 250/396 R; 250/396 ML
[58] Field of Search ................. 250/311, 310, 396 ML, 250/396 R

[56] References Cited

U.S. PATENT DOCUMENTS

2,919,381 12/1959 Glaser ............................. 250/396 R

Primary Examiner—Jack I. Berman
Assistant Examiner—Kiet T. Nguyen
Attorney, Agent, or Firm—Walter Ottesen

[57] ABSTRACT

The invention relates to an imaging corrector of the Wien type which is especially suitable for use in an electron microscope. The corrector includes an arrangement of at least eight electrodes and at least eight magnetic poles and is mounted between two electron lenses. The corrector simultaneously corrects the chromatic and spherical aberrations especially of electron lenses of low-voltage electron microscopes. The corrector begins and ends at intermediate image planes and has an intermediate image plane in its center. The intermediate image plane at the center coacts with two symmetry planes located between the intermediate image planes for the desired imaging characteristics. All chromatic and spherical aberrations for electrons of any desired energy can be corrected with two of the correctors coacting with a thick telescopic round lens disposed therebetween.

11 Claims, 5 Drawing Sheets

WIEN-TYPE IMAGING CORRECTOR FOR AN ELECTRON MICROSCOPE

FIELD OF THE INVENTION

The invention relates to an imaging corrector of the Wien type for electron microscopes having an arrangement of at least eight electrodes and eight magnetic poles which generate electrical and magnetic correction fields The electron microscope has at least one objective lens and at least one image-transmitting lens with the corrector being arranged between an objective lens and an image-transmitting lens.

BACKGROUND OF THE INVENTION

According to the Scherzer theorem, it is not possible to prevent axially chromatic and spherical aberration in rotational symmetrical electron lenses. The aperture aberration dominates and limits the resolution of electron microscopes and microprobes at voltages greater than 50 KV.

The chromatic aberration limits the resolution significantly especially at potential voltages less than 5 KV between the source and the object plane. This low voltage electron microscopy is utilized for controlling the following: microcircuits, the direct investigation of surfaces of nonconductors, biological objects as well as semiconductors having high spatial resolution.

The limitation caused by the chromatic aberration results from the fact that the penetration depth of the incident electrons on the object extends only a few atom layers at acceleration voltages of between 30 and $10^3$V. This leads to the condition that the resolution is essentially limited by the diameter of the electron probe and not by the exiting depth of the secondary electrons.

The wavelength of the incident electrons is significantly less than the obtainable resolution. A rough estimate shows that the chromatic aberration is by far the most limiting and for a resolution of 1 nm at 1 KV, the spherical as well as the chromatic aberration must be eliminated.

Up until now, the electrical and magnetic octupole corrections afford the only possibility for simultaneous correction of the axially chromatic and spherical aberration. In this connection, reference may be made to the article by H. Rose entitled "Abbildungseigenschaften sphärisch korrigierter elektronenoptischer Achromate", Optik, Volume 33, pages 1 to 23 (1971) and the further article by H. Rose entitled "Elektronenoptische Aplanate", Optik, Volume 34, pages 285 to 311 (1971). Unfortunately, these known systems all comprise many elements which are difficult to adjust. Furthermore, the elements are very sensitive with respect to mechanical vibrations and the changes of the individual quadrupole fields. This notwithstanding, it could be shown that these filters are in a position to correct electron lenses. Reference may be made to the article by H. Koops, entitled "Erprobung eines chromatisch korrigierten elektronenmikroskopischen Objektives", Optik, Volume 52, pages 1 to 17 (1978/1979) and the article by W. Bernhard entitled "Erprobung eines sphärisch und chromatisch korrigierten Elektronenmikroskopes", Optik, Volume 57, pages 73 to 93 (1980).

It is very helpful if the paraxial beam path within the corrector is configured so as to be rotationally symmetrical in order that the number of correcting elements can be reduced thereby simplifying the adjustment. This is, for example, the case in systems which consist of round lenses and sextupoles. These systems can be corrected with respect to the spherical aberration. The article by V. Beck entitled "A hexapole spherical aberration corrector", Optik, Volume 53, pages 241 to 255 (1979) is pertinent as is the article by H. Rose entitled "Correction of Aperture Aberrations in Magnetic Systems with Threefold Symmetry", Nuclear Instruments and Methods, Volume 187, pages 187 to 199 (1981). In this case, the spherical aberration of round lenses is compensated by means of a combined aberration of two spatially separated sextupoles. The system described in the above-cited article entitled "Correction of Aperture Aberrations in Magnetic Systems with Threefold Symmetry" has no errors of the second and fourth order and it is therefore suitable also as a corrector for quiescent-image transmission electron microscopes. Unfortunately, these systems cannot be utilized for correcting the axially chromatic aberration.

An inhomogeneous Wien filter, which is corrected for all geometrical aberrations of the second order, was already suggested in the article by H. Rose entitled "The retarding Wien filter as a high-performance imaging filter", Optik, Volume 77, pages 26 to 34 (1987). In addition to a high dispersion, this filter has an axially chromatic aberration which unfortunately has the same sign as the chromatic aberration of a round lens. A filter of this kind can therefore not be applied to correct the axially chromatic aberration.

SUMMARY OF THE INVENTION

It is an object of the invention to provide an imaging corrector which eliminates the axially chromatic aberration of an imaging total system, preferably in electron microscopes.

In addition, such a corrector which can be successfully utilized in practice, must be easy to align and rather stable with respect to small fluctuations of the electric and magnetic fields. Moreover, the corrector must consist of as few elements as possible and the correction must not introduce other aberrations if a significant improvement in resolution is to be achieved.

The imaging corrector of the invention is of the Wien type and is for an electron microscope having an electron-optical system defining an optical axis. The electron-optical system has an objective lens and an image-transmitting lens arranged on the axis. The objective lens defines a first intermediate image plane transverse to this axis and the image-transmitting lens defines a second intermediate image plane also transverse to said axis. The first and second image planes are disposed between the lenses in spaced relationship to each other.

The corrector is arranged between the lenses and includes: forward and rearward ends disposed on the first and second intermediate image planes, respectively; the electron-optical system defining a third intermediate image plane ($Z_2$) and the corrector having a center coincident with the third intermediate image plane ($Z_2$); the corrector being built into the electron-optical system and defining first and second symmetry planes ($S_1$, $S_3$) on respective sides of the third intermediate image plane ($Z_2$); at least eight electrodes and at least eight magnetic poles for generating electrical and magnetic correcting fields for causing rays $W_\gamma$ entering the corrector parallel to the axis to trace a path through the corrector which is mirror symmetrical with respect to the third intermediate image plane ($Z_2$) and which intersects the axis within the corrector at first and second intersect points lying in the symmetry planes ($S_1$, $S_3$), respectively; the corrector having a first corrector half between the first intermediate image plane ($Z_2$) and the third intermediate image plane and containing the first symmetry plane ($S_1$); and, the corrector having a second corrector half between the second intermediate image plane and the third intermediate image plane ($Z_2$) containing the second symmetry plane ($S_2$); the path being point symmetrical with respect to the first intersect point and referred to the axis in the first corrector half; and, the path being point symmetrical with respect to the second intersect point and referred to the axis in the second corrector half.

With this imaging corrector of the Wien type having a 1:1 imaging characteristic, it is generally possible to obtain a correction of the chromatic aberration. Furthermore, a simultaneous correction of the spherical aberration for electrons having a specific nominal energy is possible. This energy is dependent on the parameters of the corrector and the ratio of the potentials of the object and the corrector.

The corrector is nondispersive and double focussing so that no chromatic aberrations of zero order occur in the image plane. The fringe fields do not influence the imaging since the entry of the electrons into the corrector as well as their exit therefrom occurs at an intermediate image plane.

All geometric aberrations of an even order disappear because of the double symmetry of the paraxial paths within the corrector. Furthermore, the double symmetry in the corrector assures that no off-axis chromatic aberrations and no dispersions of the second degree are generated in the image plane by the corrector. Simultaneously, no coma of the third order occurs in this corrector. For this reason, a significant improvement of the resolution of off-axis points results. This inhomogeneous corrector of the Wien type is therefore suitable for raster electron microscopes as well as for emission microscopes.

A simple adjustment between the electron lenses is assured because of the compact configuration of the corrector as a component. The requirements on the relative stability of the electrical and magnetic dipole and quadrupole currents with $10^6$ for 1 nm at 1 KV is less than for other systems whereby a good technical control is provided. The sextupole circuit and the octupole circuit require far less stability of the electrical supply as has been required up until now in electron microscopes.

The corrector must be arranged between the objective lens and the first image-transmitting lens so that the necessary apertures ahead of the correction do not become too large. In this connection, the intermediate magnification M of the image in the entry plane $Z_1$ of the corrector should be in the range $1 \leq M \leq 2$.

It is advantageous to provide an additional correcting filter having electrical and magnetic quadrupole fields rearward of the electron lens following the corrector of the Wien type in the beam direction. In this way, a correction of the spherical aberration for those electrons can be carried out having energies which deviate from the nominal energy. This arrangement is especially advantageous in the rearward focal plane of this electron lens because then no magnification color aberration occurs.

The correction of the spherical aberration with the aid of additional electrical and magnetic sextupole fields within the corrector generates an axially chromatic astigmatism. This is compensated by the added electrical and magnetic quadrupole fields with the element being arranged about the focal point of the image-transmitting lens so that no off-axis errors deteriorate the correction result.

The use of the nondispersive corrector of the Wien type is, because of its simplicity, the most advantageous for low voltage electron microscopes having potentials of between 0.5 and 5 KV (referred to the source having the potential zero) since primarily the chromatic aberrations act to limit resolution.

The required field intensities and the electrical supplies are determined by the structural size of the corrector. In order to hold the supply voltages, supply currents and field intensities within controllable limits and without simultaneously reducing the mechanical manufacturing tolerances too greatly, the structural length of the filter should lie between 20 and 60 millimeters at a bore radius of 2 to 5 millimeters.

The easy adjustability provided by the compactness of the corrector of the Wien type can be still further supported by an adjustment of each individual multipole field with this adjustment being independent of other fields. In this way, all fields are generated within the interior of the corrector, that is, the electrical as well as the magnetic multipole fields.

A mathematical predimensioning based on corrective conditions for the corrector is undertaken in order to easily dimension the corrector and thereby hold its structural size within limits. The particular corrector specification is then based on this predimensioning. For carrying out the predimensions, the equations recited below can be used.

$$\Phi_1 = \nu \cdot \Psi_1 \tag{1}$$

$$\frac{\Phi_1}{\Phi_c} = \frac{4\pi \sqrt{2}}{L} \tag{2}$$

$$\Phi_2 - \nu\Psi_2 = \frac{1}{8} \frac{\Phi_1^2}{\Phi_c} \tag{3}$$

$$\Phi_3 - \nu\Psi_3 = \frac{1}{4} \Phi_2 \frac{\Phi_1}{\Phi_c} - \frac{1}{32} \frac{\Phi_1^3}{\Phi_c^2} \tag{4}$$

$$\Phi_4 - \nu\Psi_4 = \frac{1}{4} \Phi_3 \frac{\Phi_1}{\Phi_c} + \frac{1}{8} \frac{\Phi_2^2}{\Phi_c} - \tag{5}$$

$$\frac{3}{32} \Phi_2 \frac{\Phi_1^2}{\Phi_1^2} + \frac{5}{512} \frac{\Phi_1^4}{\Phi_c^3}$$

$$\Phi_3 = \frac{10}{3} \frac{\Phi_2^2}{\Phi_c} - \frac{1}{36} \Phi_2 \frac{\Phi_1}{\Phi_c} - \frac{1}{72} \frac{\Phi_1^3}{\Phi_c^2} \tag{6}$$

$$L\left(1 - 4\frac{\Phi_2 \Phi_c}{\Phi_1^2}\right) = C_{c2} + C_{c1} M^2 \left(\frac{\Phi_c}{\Phi_0}\right)^{3/2} \tag{7}$$

$$\frac{3}{4}\left[\frac{C_{c2}}{L} + \frac{C_{c1}}{L} M^4 \left(\frac{\Phi_c}{\Phi_0}\right)^{3/2}\right] + \frac{1}{4} = \frac{C_{s2}}{L} + \tag{8}$$

$$\frac{C_{s1}}{L} M^2 \left(\frac{\Phi_c}{\Phi_0}\right)^{3/2} + \frac{1}{2}\left[\frac{C_{c2}}{L} + \frac{C_{c1} M^2}{L}\left(\frac{\Phi_c}{\Phi_0}\right)^{3/2}\right]^2$$

wherein the above variables have the following meaning:

L—effective length of the multipole fields
M—magnification ahead of the Wien filter
v—velocity of the electrons
$C_{s1}$—coefficient of the spherical aberration of the first lens
$C_{s2}$—coefficient of the spherical aberration of the second lens
$C_{c1}$—coefficient of the axial chromatic aberration of the first lens
$C_{c2}$—coefficient of the axial chromatic aberration of the second lens
$\Phi_o$—electrical normal potential of the electrons
$\Phi_c$—electrical potential on the optical axis of the Wien filter
$\Phi_1$—electrical dipole coefficient of the Wien filter
$\Psi_1$—magnetic dipole coefficient of the Wien filter
$\Phi_2$—electrical quadrupole coefficient of the Wien filter
$\Psi_2$—magnetic quadrupole coefficient of the Wien filter
$\Phi_3$—electrical hexapole coefficient of the Wien filter
$\Psi_3$—magnetic hexapole coefficient of the Wien filter
$\Phi_4$—electrical octupole coefficient of the Wien filter
$\Psi_4$—magnetic octupole coefficient of the Wien filter If a corrector is needed which corrects the chromatic aberration and the spherical aberration for electrons of any desired energy in raster electron microscopes as well as in transmission electron microscopes, then in lieu of one corrector, two correctors can be used between which a thick telescopic round lens is disposed and this round lens can be realized by a round lens doublet. Alternatively, the corrector can also consist of a corrector of the Wien type, two transfer lenses and two multipoles driven as hexapoles.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
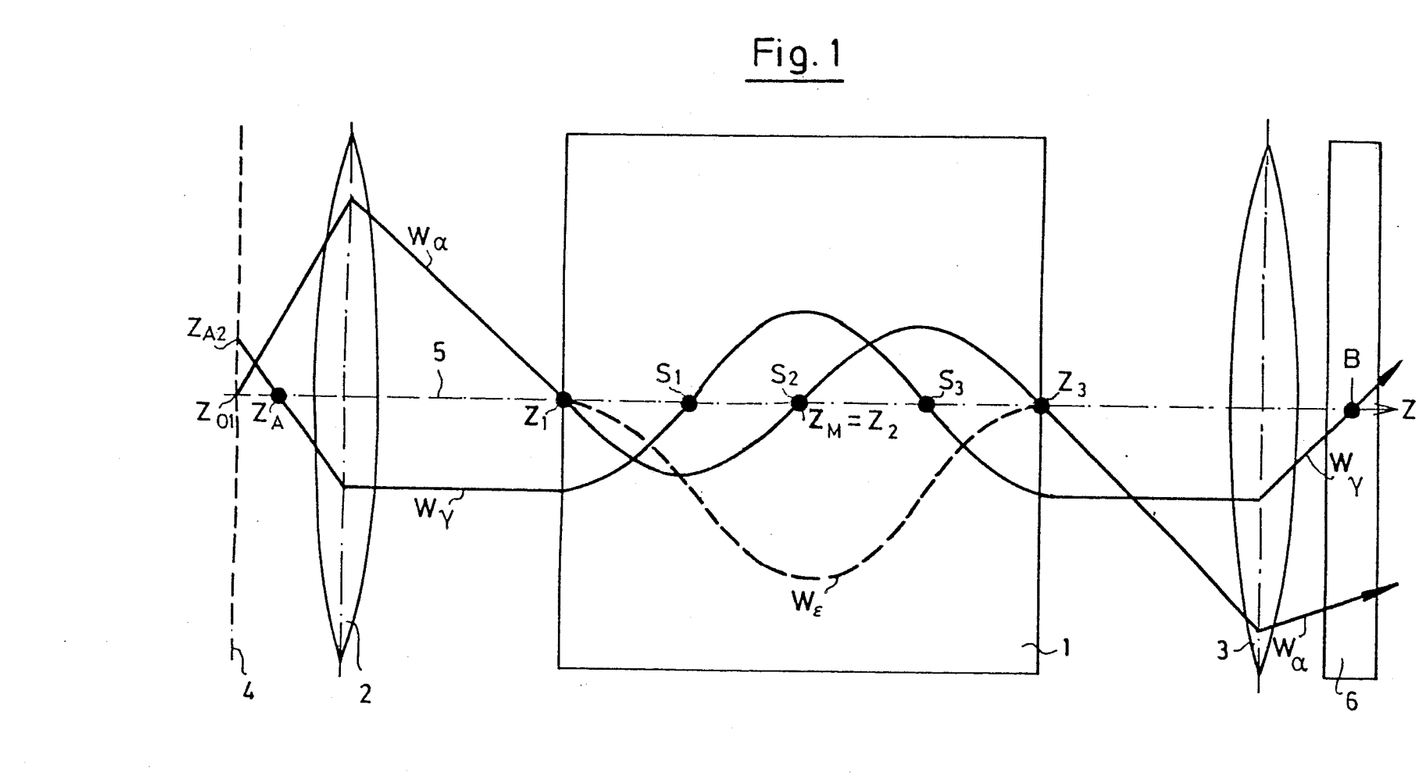
FIG. 1 is a schematic showing the arrangement of the corrector between two electron lenses of an electron microscope.

The corrector 1 shown in FIG. 1 is of the Wien type and is arranged between an objective lens 2 and an image-transmitting lens 3. By means of its combination aberrations, the corrector 1 corrects the chromatic aberration as well as the spherical aberration for electrons having nominal energy. Combination aberrations of a corrector 1 are deliberately generated aberrations which are imparted to the electrons when passing through the corrector 1 with the aberrations having the same magnitude but having a sign opposite to the sign of the aberrations which the electrons obtain from the electron lenses (2, 3) to be corrected. That is, the combination aberrations are understood to be secondary aberrations which result from the combination of the primary aberrations of spatially separated elements corresponding to very extended thick lenses. Even though the secondary aberrations of the corrector 1 of the Wien type have generally less effect than the primary aberrations, the secondary aberrations do however become dominant after the primary aberrations are eliminated.

The combined aberrations can be made relatively large since they increase in proportion to the distance between two desired elements or with the length of an extended element In contrast to the primary aberrations, the sign of the secondary aberrations can be made positive or negative in dependence upon the path of the paraxial rays within the corrector 1, so that the primary aberrations can be corrected by means of the combination aberrations.

The focal point $Z_A$ of the objective lens 2 lies between the lens and the object plane 4. The electrons leaving the object plane 4 are imaged by the objective lens 2 onto the corrector 1. This corrector 1 is built into the imaging system of the electron microscope in such a way that it starts at the first intermediate image plane $Z_1$ after the objective lens 2. Three symmetry planes $S_1$, $S_2$ and $S_3$ are perpendicular to the optical axis 5 and are disposed within the corrector 1.

Those electrons which enter the corrector 1 parallel to the optical axis 5 intersect the optical axis 5 in the first and third symmetry planes $S_1$ and $S_3$.

A further symmetry plane $S_2$ ($Z_2 = Z_M$) is disposed in the center of the corrector between the two symmetry planes $S_1$ and $S_3$. This symmetry plane $Z_M$ is at the same time an intermediate image plane $Z_2$ of the electron-optical system. The corrector 1 ends at a third intermediate image plane $Z_3$ and this third intermediate image plane $Z_3$ is assigned to the image-transmitting lens 3.

The electrons leave the corrector 1 corrected without a displacement being effected outside of the corrector 1. These electrons are then imaged into the image plane (not shown) by the image-transmitting lens 3 located downstream. A further electrical and magnetic quadrupole 6 is arranged about the focal point B, which is remote from the object, of the image-transmitting lens 3 and is located behind this lens 3. This electrical and magnetic quadrupole corrects the chromatic astigmatism. The quadrupole 6 is only necessary if the correction of the spherical aberration is to be carried out for any desired object potential.

Three electron paths $W_\alpha$, $W_\gamma$ and $W_\epsilon$ are also shown in FIG. 1 to emphasize the function of the corrector 1 between an objective lens 2 and an image-transmitting lens 3.

The electrons which exit from the object plane 4 at the optical axis 5 at $Z_{01}$ and which enter the corrector 1 on this optical axis 5, leave the corrector again at the optical axis 5. Within the corrector 1, the electrons do leave the optical axis 5 in order to follow the electron beam path $W_\alpha$. However, the symmetry conditions of the corrector 1 are so configured that the path deviations in the first corrector half between $Z_1$ and $Z_2$ are completely compensated by the path deviations in the second corrector half between $Z_2$ and $Z_3$. The center intermediate image plane $Z_M = Z_2$ is a mirror plane for these electrons.

The inflection points of the electron beam path $W_\epsilon$ lie in the symmetry planes $S_1$ and $S_2$. The electron path $W_\epsilon$ is proportional to the relative energy loss $\Delta E/E_o$ of the electrons. For this reason, axial electrons having the desired energy $E = E_o$ are therefore not influenced by the corrector.

In contrast, if the electrons leave the object plane 4 at their intersect point $Z_{01}$ with the optical axis 5 of the electron microscope but at a specific angle and follow the electron path $W_\alpha$, these electrons are then deflected by the objective lens 2 such that they intersect the optical axis 5 at the first intermediate image plane $Z_1$ for the first time. The electrons then enter into the corrector 1 beginning at this intermediate plane $Z_1$ at a specific angle. Because of the symmetry conditions of the corrector 1, the electrons which follow the electron path $W_\alpha$ experience a reflection at a plane at the symmetry planes $S_1$ and $S_3$ while the electrons experience a point reflection at the center intermediate image plane $S_2$ ($Z_M = Z_2$). These electrons then exit from the corrector 1 at the entrance angle since the corrector 1 ends at an intermediate image plane $Z_3$.

Electrons which exit from the object plane 4 off-axis and which follow the electron path $W_\gamma$ from the point $Z_{A2}$ and whose path $W_\gamma$ runs through the focus $Z_A$ of the objective lens 2 at the object side, enter the corrector 1 parallel to the optical axis 5. These electrons intersect the optical axis 5 in the symmetry planes $S_1$ and $S_3$ where these electrons experience a point reflection. In contrast, these electrons experience a reflection at the plane at the center symmetry plane $Z_M = Z_2$.

In order to build a corrector 1 of the kind described above, it is helpful to first determine the quantities resulting from the various conditions. A connection exists between the characteristics of the combined aberrations and the characteristics of the primary aberrations of elements having rotational symmetrical paraxial rays. The combined aberrations have the order $n = n_1 + n_2 - 1$ and the multiplicity $m = |m_1 + m_2| \leq n + 1$ wherein $n_1$ and $n_2$ are the respective orders and $m_1$ and $m_2$ are the respective multiplicities of the primary aberrations.

The multiplicity of each of the multipole components of the electrical and magnetic fields about the original axis is reduced by one with reference to the new axis if the rays run displaced from the optical axis of the corrector 1 by a small amount $\Delta$. The inhomogeneous corrector 1 of the Wien type has a field component of the order $n_1 = 2$ and of the multiplicity $m_1 = 1$ with reference to the optical axis 5. A small displacement $\Delta$ from the beam axis ($n_2 = 0$, $m_2 = 1$), which is proportional to the relative energy deviation $\epsilon = \Delta\Phi/\Phi = \Delta E/E$ of an electron, results in a chromatic aberration in the order $n = 2 - 0 - 1 = 1$ and the multiplicity $m = |1 + 1|$. The energy of the electron differs from the nominal energy $E = m v^2/2 = e\Phi$ by the quantity $E = e \Delta\Phi$. Electrons of this energy are not diverted by the corrector. $\Phi$ is the electrical potential on the axis 5 within the corrector 1 and $e$, $m$ and $v$ are the charge, the mass and the axial velocity of the nondiverted electron, respectively.

In accordance with the above, the inhomogeneous corrector 1 has a chromatic astigmatism of the first order ($m = 2$) and a rotational symmetrical chromatic aberration ($m = 0$). The rotational symmetrical chromatic aberration is used to compensate for the axially chromatic aberration of both round lenses (2, 3).

The axially chromatic aberration can be made negative since the corrector 1 is driven in the non-dispersive mode. The electrons which originally moved along the optical axis 5 again move along this axis 5 independently of their energy after passing through the corrector 1. Within the corrector 1, the electron paths are displaced from this axis 5 in dependence upon their relative energy deviations $\epsilon$.

Since the rays $W_\alpha$ and $W_\gamma$ run asymmetrically with respect to at least one of the symmetry planes $S_1$, $S_2$ and $Z_2$, all geometric aberrations of the second order disappear. For this reason, the electrical quadrupole force of corrector 1 can be selected as a free parameter as desired. This affords the advantage that the axially chromatic aberration of the corrector 1 is not fixed; instead, it can be changed as a function of the electric quadrupole intensity. The effect of this variation on the paraxial electrons having nominal energy ($\epsilon = 0$) is compensated by a suitable adjustment of the magnetic quadrupole intensity.

The conditions which result from these embodiments can be summarized in the mathematical equations (1) to (8) delineated above. The electrical and magnetic fields resulting from the above can be generated with a multipole having at least eight discrete electrically and magnetically controllable poles.

Equation (1) recites the Wien condition for linear axes of dipoles and equation (2) characterizes the condition that the corrector of the Wien type 1 is nondispersive. With equation (3), the condition is obtained that the corrector 1 is always free of axial astigmatism. The corrector 1 performs in the manner of a telescopic round lens in paraxial approximation for electrons having $\epsilon = 0$. Equation (4) provides that the system has no chromatic astigmatism. With equations (5) and (6), the condition is obtained that the spherical aberration of the third order of the corrector is rotationally symmetric (compensation of the four-multiple portion and of the two-multiple portion). The equation (7) is necessary for correcting the chromatic aberration of the entire system. A simultaneous correction of the spherical aberration is obtained with the last equation (8). Equation (4) must be omitted in the event that the spherical aberration is to be corrected, that is, also for electrons not having nominal energy. In this way, an axially chromatic astigmatism occurs which can, however, be corrected by means of the electrical and magnetic quadrupole 6 additionally accommodated in the electron-optical system. So that no off-axis aberrations occur for this compensation, the quadrupole 6 must be so arranged that image B of the focal plane $Z_A$ of the objective lens lies in the center of the quadrupole.

The dimensions of the corrector 1 should be so selected that no electrical and magnetic fields which are too strong have to be built up. This is the case, for example, for the corrector 1 having a structural length of 50 mm and a bore diameter of 4 mm. The corrector must be at a potential of approximately 5 to 10 KV measured to the cathode in order that the stability of the field generation is assured.

A significant increase in the resolution occurs because after the correction of the spherical aberration of the third order and of the chromatic aberration of the first degree by the corrector 1, the resolution is only limited by the spherical aberration of the fifth order and the chromatic aberration of the first order and of the second degree.

Figure 2:
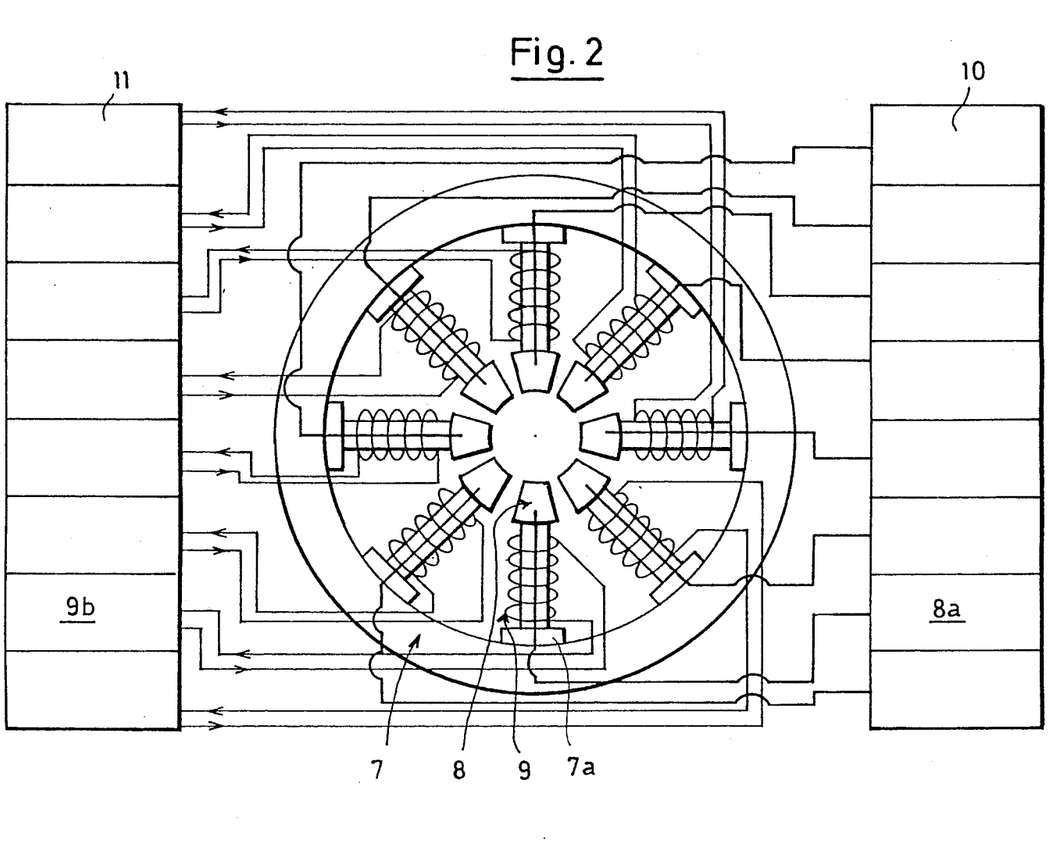
FIG. 2 is a plan view of the corrector as an octupole with the current and voltage supply.
Figure 3:
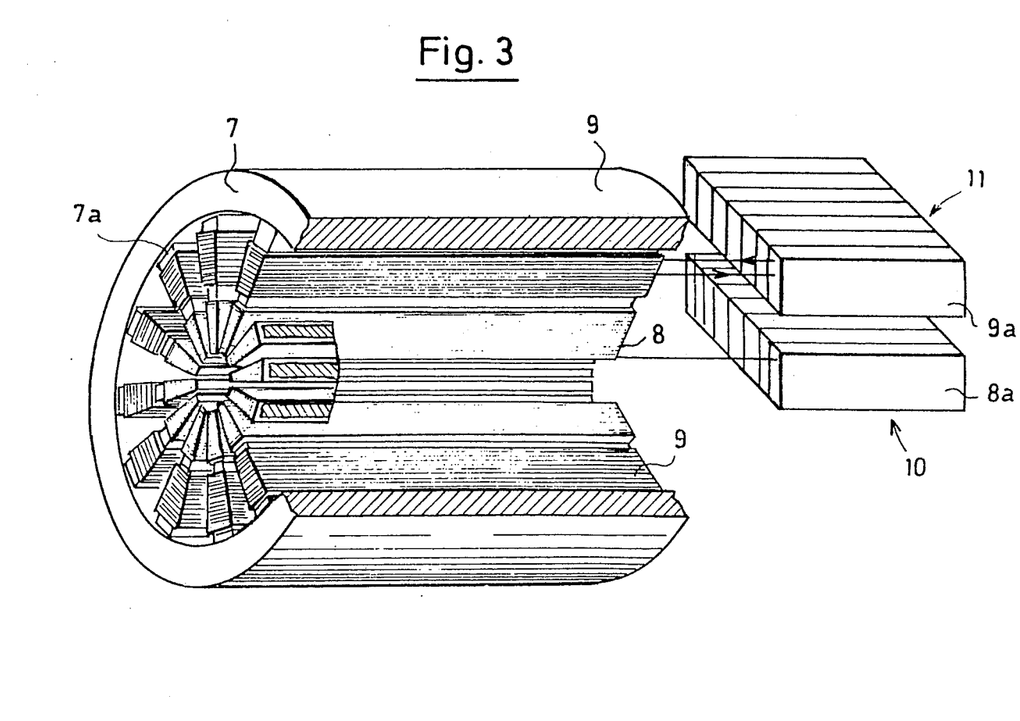
FIG. 3 is a three-dimensional view of FIG. 2.

A suitable corrector having the smallest number of poles is shown in FIGS. 2 and 3. The corrector is an electrical and magnetic octupole for generating the four electrical and four magnetic fields required for the correction. What is important is that each of the multipoles can be adjusted electrically and magnetically discretely and independently of all other poles. This substantially facilitates the adjustment during assembly. Each of the eight pole caps 8 are discretely supplied by their own voltage generating devices 8a and each of the eight coils 9 are discretely supplied by their own current generating devices 9b. The poles are mounted in a circular arrangement in an annular jacket 7 so as to be equally spaced one from the other. The pole shoes 7a provide for insulation with respect to the annular jacket 7. The technical preconditions for multipole systems are discussed especially in the article of H. Hely entitled "Technische Voraussetzungen für die Verbesserung der Korrektur von Elektronenlinsen", Optik, Volume 60, No. 3, pages 307 to 326 (1982) and the article of M. Haider et al entitled "Design and test of an electric and magnetic dodecapole lens", Optik, Volume 63, No. 1, pages 9 to 23 (1982). An easily workable and thermally stable ceramic is especially suitable as a carrier material.

Figure 4:
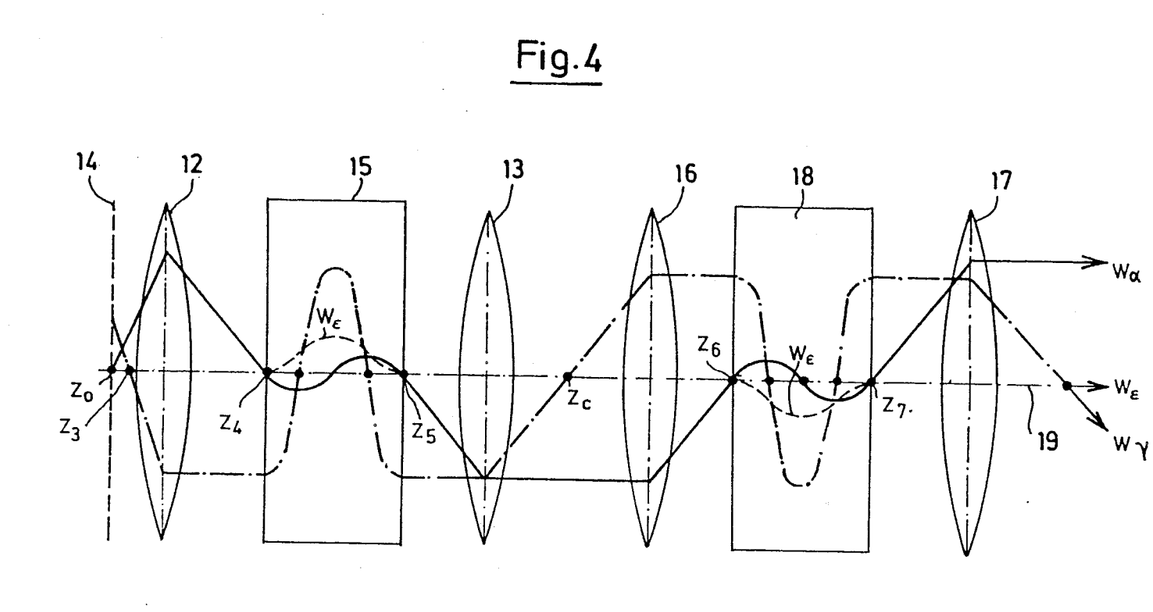
FIG. 4 is a corrector arrangement for a transmission electron microscope.

A corrector arrangement is shown in FIG. 4 which is suitable for a raster electron microscope as well as for a transmission electron microscope. In principle, a corrector arrangement according to FIG. 1 would also be suitable for a transmission electron microscope. The arrangement shown in FIG. 1 with an additional electrical and magnetic quadrupole 6 is suitable only for a raster electron microscope since the length of the quadrupole as a correction element for all electrons of FIG. 1 deviating from the nominal energy must generally be substantially greater than the focal length of the image-transmitting lens 3. If the arrangement is to be used in a transmission electron microscope, it would no longer be possible because of spatial reasons to center the quadrupole in the focal point of the image-transmitting lens 3. Large off-axis errors occur with the presence of an octupole which would make the arrangement unsuitable for mounting in a transmission electron microscope. This problem is circumvented with the arrangement according to FIG. 4.

The arrangement of a corrector shown in FIG. 4 between an objective lens 12 and an image-transmitting lens 17 consists of two correctors (15, 18) of the type described with respect to FIG. 1 and includes a thick telescopic round lens which is realized in FIG. 4 by two round lenses (13, 16) (round lens doublet). The current directions in the two round lenses (13, 16) must be opposite so that the two magnetic round lenses (13, 16) between the two correctors (15, 18) can be rotationally free for the electrons.

The first corrector 15 is disposed in the intermediate image plane $Z_4$ behind the objective lens 12, that is, on the side of the objective lens 12 opposite to the object plane 14. The course of the electron paths in the interior of the corrector 15 corresponds to the paths shown in FIG. 1. A further intermediate image plane $Z_5$ is disposed at the end of the corrector 15. Two round lenses (13, 16) follow on the optical axis 19 between which an intermediate image plane $Z_c$ is disposed. The second corrector 18 begins in the intermediate image plane $Z_6$ after these two round lenses (13, 16) and ends at a further intermediate image plane $Z_7$ ahead of the image-transmitting lens 17.

With the arrangement shown in FIG. 4, the chromatic aberration and the spherical aberration of all round lenses of the system can be corrected for all energies of the electrons in a raster electron microscope as well as in a transmission electron microscope. The correctors (15, 18) must lie at a potential of approximately 5 to 10 KV measured to the cathode.

The potential at the object can be selected as desired in dependence upon whether the objective lens 12 is driven as an accelerating lens or as a retarding lens. The image-transmitting lens 17 can be either a magnetic lens or an electric accelerating lens in dependence upon what energy the electrons are intended to have in the image plane. The dipole fields and the quadrupole fields of both correctors (15, 18) are the same size. In contrast, the sextupole fields are of different size and have opposite signs. Their values are adjusted to be equal pursuant to the equations (1) to (8) and are optimized during the fine adjustment. This fine adjustment is necessary in any event since the values according to the equations (1) to (8) provide the possible adjustment of the poles only for a coarse adjustment (theoretical value determinations with the equations (1) to (8)). The mechanical tolerances of the manufacture as well as the various effects of the different materials used with reference to the generation of the field compel a fine adjustment. This fine adjustment can for example be determined experimentally based on diffraction figures as described in the article by M. Haider et al entitled "Design and test of an electric and magnetic dodecapole lens", Optik, Volume 63, No. 1, pages 21 to 23 (1982) or in the known manner with the aid of diffraction seams made of perforated foils.

Figure 5:
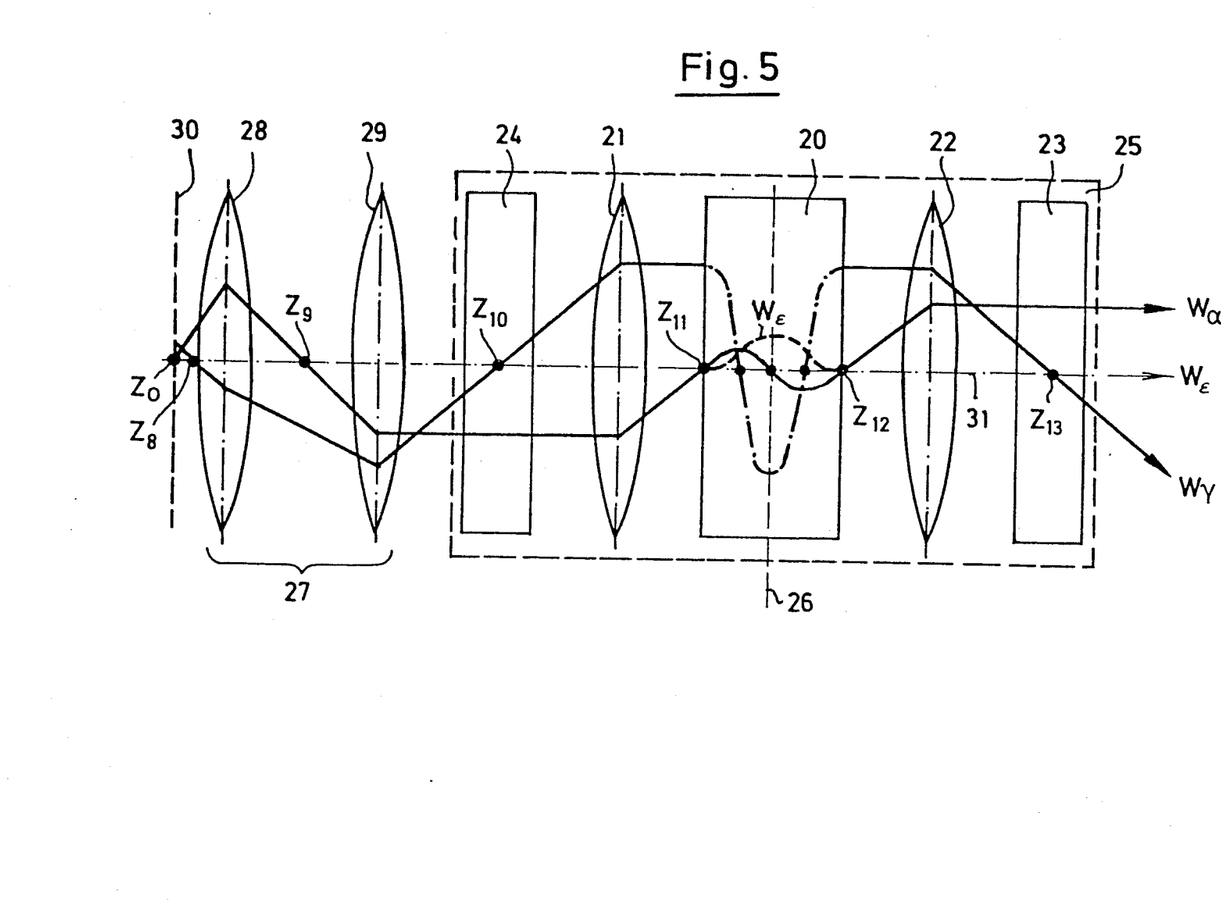
FIG. 5 is an alternate corrector arrangement to that shown in FIG. 4.

The correction arrangement described with respect to FIG. 5 can still be improved in that only one corrector of the Wien type 20 is required. This permits a simpler operation since only one corrector of the Wien type 20 has to be isolated from ground and highly stabilized. This advantage is obtained in that the corrector of the Wien type 20 is mounted between two transfer lenses (21, 22).

This corrector 20 begins at the focal plane ($Z_{11}$) of the first transfer lens 21 and ends at the focal plane $Z_{12}$ of the second transfer lens 22 with the focal plane $Z_{11}$ being at the object side and the focal plane $Z_{12}$ being at the image side. Both transfer lenses (21, 22) must be identical in their configuration and with respect to their excitation.

The corrector of the Wien type 20 is so excited that no chromatic astigmatism of the first order is generated. This is obtained in that the conditions of equations (1) to (7) are fulfilled. The condition of equation (8) for the elimination of the spherical aberration of the third order can however not be fulfilled if the potential of the object is of any desired value.

For correcting the spherical aberration, two electrical or magnetic multipoles (23, 24) of equal strength are provided which are excited as hexapoles.

The first of these multipoles 24 is centered in the focal point $Z_{10}$ of the first transfer lens 21 with the focal point $Z_{10}$ being at the object side. The second of these multipoles 23 is centered in the image side focal point $Z_{13}$ of the second transfer lens 22. The transfer lenses (21, 22) are constructed as weak round lenses. The transfer lenses (21, 22) must be electrical if the energy of the electrons ahead of the first transfer lens 21 is not in the range of 5 to 10 keV. If the energy is greater than 5 to 10 keV, then the first transfer lens 21 acts as a retarding lens and the second transfer lens 22 acts as an accelerating lens. In this case, the corrector of the Wien type 20 is disposed within an intermediate decelerator.

If the energy ahead of the first transfer lens 21 is between 5 and 10 keV, then electrical or magnetic individual lenses can be used as transfer lenses (21, 22). An individual lens is such a lens which has the same electrical potential at the object and image sides. The current directions in the two lenses must be mutually opposite in the case of the use of magnetic transfer lenses.

The geometry and the diffraction forces of the two transfer lenses (21, 22) must be identical. The total corrector 25 thereby consists of two like hexapoles (23, 24), two like transfer lenses (21, 22) and a corrector of the Wien type 20. The total corrector 25 is symmetrical with reference to the center plane 26 and to the optical axis 31.

The significant advantage of the total corrector 25 is that only one element 20 must be driven as highly stable (especially its dipole and quadrupole fields). In contrast, the stability of the hexapole fields can be lower by an order of magnitude of 1 to 2.

An objective double lens 27 is necessary since the total corrector 25 is built into a transmission electron microscope which has a high image point number (image point number equals the number of equally well resolved image points along an image diameter). This objective double lens is shown in FIG. 5 and is defined by the two lenses (28, 29). The use of such an objective double lens 27 on the object plane 30 affords the advantage that its coma-free plane can be placed outside of the field region of the lens 27. This is obtained in that an intermediate image $Z_9$ is placed in the interior of the objective double lens 27. By placing the coma-free plane $Z_{10}$ of the objective double lens 27 in the center of the first multipole 24 driven as a hexapole, and thereby in the object side focal plane $Z_{10}$ of the first transfer lens 21, the condition is obtained that no coma of the third order occurs in the overall system. Furthermore, the condition is obtained that the image plane $Z_{10}$ of the first transfer lens 21 is simultaneously a coma-free plane of the overall corrector 25 and the coma-free condition of the objective double lens 27 is always guided at the total corrector 25. The total corrector 25 can thereby also be referred to as an electron-optical aplanat.

The intermediate image lies at infinity behind the total corrector 25 in the beam paths W shown in FIG. 5. With the aid of the second lens 29 of the objective double lens 27, the position of the intermediate image behind the total corrector 25 can be regulated as desired during operation without the geometry of the overall corrector 25 having to be changed. This adjustment can require a follow-up regulation of the correction fields as may be required.

It is understood that the foregoing description is that of the preferred embodiments of the invention and that various changes and modifications may be made thereto without departing from the spirit and scope of the invention as defined in the appended claims.

What is claimed is:

1. An imaging corrector of the Wien type for an electron microscope having an electron-optical system defining an optical axis and having an objective lens and an image-transmitting lens arranged on said axis, the objective lens defining a first intermediate image plane transverse to said axis and said image-transmitting lens defining a third intermediate image plane also transverse to said axis, and said first and third image planes being disposed between said lenses in spaced relationship to each other, said corrector being arranged between said lenses and comprising:

forward and rearward ends disposed on said first and third intermediate image planes, respectively;

said electron-optical system defining a second intermediate image plane ($Z_2$) and said corrector having a center coincident with said second intermediate image plane ($Z_2$);

said corrector being built into said electron-optical system and defining first and third symmetry planes ($S_1$, $S_3$) on respective sides of said third intermediate image plane ($Z_2$);

at least eight electrodes and at least eight magnetic poles for generating electrical and magnetic correcting fields for causing rays $W_\gamma$ entering said corrector parallel to said axis to trace a path through said corrector which is mirror symmetrical with respect to said second intermediate image plane ($Z_2$) and which intersects said axis within said corrector at first and third intersect points lying in said symmetry planes ($S_1$, $S_3$), respectively;

said corrector having a first corrector half between said first intermediate image plane and said second intermediate image plane ($Z_2$) and containing said first symmetry plane ($S_1$);

said corrector having a second corrector half between said third intermediate image plane and said second intermediate image plane ($Z_2$) and containing said second symmetry plane ($S_3$);

said path being point symmetrical with respect to said first intersect point and referred to said axis in said first corrector half; and, said path being point symmetrical with respect to said second intersect point and referred to said axis in said second corrector half.

2. The imaging corrector of claim 1, comprising voltage supply means for energizing each one of said electrodes independently of the remaining ones of said electrodes and current supply means for energizing each one of said magnetic poles independently of the remaining ones of said magnetic poles.

3. The imaging corrector of claim 2, wherein the intermediate magnification (M) of the object field in said first intermediate image plane lies in the range of $1 \leq M \leq 2$.

4. The imaging corrector of claim 1, said corrector being a total corrector built into said electron-optical system and comprising:

first and second transfer lenses defining respective inner focal points ($Z_{11}$, $Z_{12}$) disposed on said axis in corresponding ones of said first and second intermediate image planes thereby placing said corrector between said transfer lenses;

said first and second transfer lenses having respective outer focal points ($Z_{10}$, $Z_{13}$);

first and second hexapoles centered on corresponding ones of said focal points;

said first and second transfer lenses and said first and second hexapoles being symmetrical with respect to said third intermediate image plane; and, said Wien-Type corrector fulfilling the conditions of the following equations (1) to (7):

$$\Phi_1 = \nu \cdot \Psi_1 \tag{1}$$

$$\frac{\Phi_1}{\Phi_c} = \frac{4\pi \sqrt{2}}{L} \tag{2}$$

$$\Phi_2 - \nu \Psi_2 = \frac{1}{8} \frac{\Phi_1^2}{\Phi_c} \tag{3}$$

$$\Phi_3 - \nu \Psi_3 = \frac{1}{4} \Phi_2 \frac{\Phi_1}{\Phi_c} - \frac{1}{32} \frac{\Phi_1^3}{\Phi_c^2} \tag{4}$$

$$\Phi_4 - \nu \Psi_4 = \frac{1}{4} \Phi_3 \frac{\Phi_1}{\Phi_c} + \frac{1}{8} \frac{\Phi_2^2}{\Phi_c} - \tag{5}$$

$$- \frac{3}{32} \Phi_2 \frac{\Phi_1^2}{\Phi_1^2} + \frac{5}{512} \frac{\Phi_1^4}{\Phi_c^3}$$

$$\Phi_3 = \frac{10}{3} \frac{\Phi_2^2}{\Phi_c} - \frac{1}{36} \Phi_2 \frac{\Phi_1}{\Phi_c} - \frac{1}{72} \frac{\Phi_1^3}{\Phi_c^2} \quad (6)$$

$$L\left(1 - 4\frac{\Phi_2\Phi_c}{\Phi_1^2}\right) = C_{c2} + C_{c1}M^2 \left(\frac{\Phi_c}{\Phi_0}\right)^{3/2} \quad (7)$$

wherein the above variables have the following meaning:
L—effective length of the multipole fields
M—magnification ahead of the Wien filter
v—velocity of the electrons
$C_{c1}$—coefficient of the axial chromatic aberration of the first lens
$C_{c2}$—coefficient of the axial chromatic aberration of the second lens
$\Phi_o$—electrical normal potential of the electrons
$\Phi_c$—electrical potential on the optical axis of the Wien filter
$\Phi_1$—electrical dipole coefficient of the Wien filter
$\Psi_2$—magnetic dipole coefficient of the Wien filter
$\Phi_2$—electrical quadrupole coefficient of the Wien filter
$\Psi_2$—magnetic quadrupole coefficient of the Wien filter
$\Phi_3$—electrical hexapole coefficient of the Wien filter
$\Psi_3$—magnetic hexapole coefficient of the Wien filter
$\Phi_4$—electrical octupole coefficient of the Wien filter
$\Psi_4$—magnetic octupole coefficient of the Wien filter 5. The imaging corrector of claim 4, said objective lens being a double objective lens defining a lens field and having a coma-free plane outside of said lens field and passing through said outer focal point ($X_{10}$) of said first transfer lens so as to pass through the center of said first hexapole.

6. The imaging corrector of claim 1, wherein said electron microscope is a low-voltage raster electron microscope.

7. The imaging corrector of claim 1, wherein said electrical and magnetic fields fulfill the requirements of the following equations (1) to (8) with respect to their variables:

$$\Phi_1 = v \cdot \Psi_1 \quad (1)$$

$$\frac{\Phi_1}{\Phi_c} = \frac{4\pi\sqrt{2}}{L} \quad (2)$$

$$\Phi_2 - v\Psi_2 = \frac{1}{8} \frac{\Phi_1^2}{\Phi_c} \quad (3)$$

$$\Phi_3 - v\Psi_3 = \frac{1}{4} \Phi_2 \frac{\Phi_1}{\Phi_c} - \frac{1}{32} \frac{\Phi_1^3}{\Phi_c^2} \quad (4)$$

$$\Phi_4 - v\Psi_4 = \frac{1}{4} \Phi_3 \frac{\Phi_1}{\Phi_c} + \frac{1}{8} \frac{\Phi_2^2}{\Phi_c} - \frac{3}{32} \Phi_2 \frac{\Phi_1^2}{\Phi_c^2} + \frac{5}{512} \frac{\Phi_1^4}{\Phi_c^3} \quad (5)$$

$$\Phi_3 = \frac{10}{3} \frac{\Phi_2^2}{\Phi_c} - \frac{1}{36} \Phi_2 \frac{\Phi_1}{\Phi_c} - \frac{1}{72} \frac{\Phi_1^3}{\Phi_c^2} \quad (6)$$

$$L\left(1 - 4\frac{\Phi_2\Phi_c}{\Phi_1^2}\right) = C_{c2} + C_{c1}M^2 \left(\frac{\Phi_c}{\Phi_0}\right)^{3/2} \quad (7)$$

$$\frac{3}{4}\left[\frac{C_{c2}}{L} + \frac{C_{c1}}{L} M^4 \left(\frac{\Phi_c}{\Phi_0}\right)^{3/2}\right] + \frac{1}{4} = \frac{C_{s2}}{L} + \frac{C_{s1}}{L} M^2 \left(\frac{\Phi_c}{\Phi_0}\right)^{3/2} + \frac{1}{2}\left[\frac{C_{c2}}{L} + \frac{C_{c1}M^2}{L} \left(\frac{\Phi_c}{\Phi_0}\right)^{3/2}\right]^2 \quad (8)$$

wherein the above variables have the following meaning:
L—effective length of the multipole fields
M—magnification ahead of the Wien filter
v—velocity of the electrons
$c_{s1}$—coefficient of the spherical aberration of the first lens
$C_{s2}$—coefficient of the spherical aberration of the second lens
$C_{c1}$—coefficient of the axial chromatic aberration of the first lens
$C_{c2}$—coefficient of the axial chromatic aberration of the second lens
$\Phi_o$—electrical normal potential of the electrons
$\Phi_c$—electrical potential on the optical axis of the Wien filter
$\Phi_1$—electrical dipole coefficient of the Wien filter
$\Psi_1$—magnetic dipole coefficient of the Wien filter
$\Phi_2$—electrical quadrupole coefficient of the Wien filter
$\Psi_2$—magnetic quadrupole coefficient of the Wien filter
$\Phi_3$—electrical hexapole coefficient of the Wien filter
$\Psi_3$—magnetic hexapole coefficient of the Wien filter
$\Phi_4$—electrical octupole coefficient of the Wien filter
$\Psi_4$—magnetic outpole coefficient of the Wien filter 8. The imaging corrector of claim 1, said corrector having a length in the range of 20 mm to 60 mm and a bore radius in the range of 2 mm to 5 mm.

9. The imaging corrector of claim 1, said image-transmitting lens defining a focal point (B) downstream thereof and defining a focal plane passing through said focal point (B); and, an electrical and magnetic quadrupole mounted in said focal plane.

10. An imaging corrector arrangement of the Wien type for an electron microscope having an electron-optical system defining an optical axis, the arrangement comprising:
an objective lens and an image-transmitting lens arranged on said axis;
said objective lens defining a first intermediate image plane ($Z_4$) transverse to said axis;
said image-transmitting lens defining a second intermediate image plane ($Z_7$) transverse to said axis;
said first and second intermediate image planes being disposed between said lenses in spaced relationship to each other;
said electron-optical system defining a third intermediate image plane ($Z_c$) transverse to said axis and centered between said lenses;
a thick telescopic round lens unit disposed on said axis and centered on said third intermediate image plane ($Z_c$);
said round lens unit defining fourth and fifth intermediate image planes ($Z_5$, $Z_6$) transverse to said axis upstream and downstream, respectively, of said lens unit;

a first corrector extending between said first intermediate image plane ($Z_4$) defining the forward end of said first corrector and said fourth intermediate image plane ($Z_5$) defining the rearward end of said first corrector;

a second corrector extending between said fifth intermediate image plane ($Z_6$) defining the forward end of said second corrector and said second intermediate image plane ($Z_7$) defining the rearward end of said second corrector;

each one of said correctors being built into said electron-optical system and defining first, second and third symmetry planes ($S_1$, $S_2$, $S_3$) with said second symmetry plane ($S_2$) being centered between said first symmetry plane ($S_1$) and said third symmetry plane ($S_3$);

each one of said correctors having at least eight electrodes and at least eight magnetic poles for generating electrical and magnetic correcting fields for causing rays $W_\gamma$ entering the corrector parallel to said axis to trace a path through the corrector which is mirror symmetrical with respect to said second symmetry plane ($S_2$) and which intersects said axis within the corrector at first and second intersect points lying in said first and third symmetry planes ($S_1$, $S_3$), respectively;

each one of said correctors having a first corrector half extending from the forward end thereof to said second symmetry plane ($S_2$) and containing said first symmetry plane ($S_1$);

each one of said correctors having a second corrector half extending from the rearward end thereof to said second symmetry plane ($S_2$) and containing said third symmetry plane ($S_3$);

said path being point symmetrical with respect to said first intersect point and referred to said axis in said first corrector half; and, said path being point symmetrical with respect to said second intersect point and referred to said axis in said second corrector half.

11. The imaging corrector arrangement of claim 10, wherein said electron microscope is a transmission electron microscope.

* * * * *

UNITED STATES PATENT AND TRADEMARK OFFICE
CERTIFICATE OF CORRECTION

PATENT NO. : 4,962,313

DATED : October 9, 1990

INVENTOR(S) : Harald Rose

It is certified that error appears in the above-identified patent and that said Letters Patent is hereby corrected as shown below:

In column 1, line 10: insert -- . -- between "fields" and "The".

In column 6, line 7: insert -- . -- between "element" and "In".

In column 6, line 53: delete "$W_\alpha$" and substitute -- $W_\epsilon$ -- therefor.

In column 7, line 30: delete "$|m_1 + m_2|$" and substitute -- $|m_1 \pm m_2|$ -- therefor.

In column 7, line 44: delete "$|1 + 1|$" and substitute -- $|1 \pm 1|$ -- therefor.

In column 11, line 67: delete "third" and substitute -- second -- therefor.

UNITED STATES PATENT AND TRADEMARK OFFICE
CERTIFICATE OF CORRECTION

PATENT NO. : 4,962,313

DATED : October 9, 1990

INVENTOR(S) : Harald Rose

It is certified that error appears in the above-identified patent and that said Letters Patent is hereby corrected as shown below:

In column 13, line 24: delete "$\Psi_2$" and substitute -- $\Psi_1$ -- therefor.

In column 13, line 37: delete "$(X_{10})$" and substitute -- $(Z_{10})$ -- therefor.

In column 14, line 39: delete "outpole" and substitute -- octupole -- therefor.

Signed and Sealed this

Seventeenth Day of March, 1992

Attest:

HARRY F. MANBECK, JR.

*Attesting Officer*      *Commissioner of Patents and Trademarks*